(12) United States Patent
Cho et al.

(10) Patent No.: US 10,477,700 B2
(45) Date of Patent: Nov. 12, 2019

(54) METHOD FOR MANUFACTURING A PRINTED CIRCUIT BOARD

(71) Applicant: Atotech Deutschland GmbH, Berlin (DE)

(72) Inventors: Wonjin Cho, Berlin (DE); Markku Lager, Berlin (DE); Dirk Tews, Berlin (DE); Cedric Lin, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 16/340,697

(22) PCT Filed: Oct. 12, 2017

(86) PCT No.: PCT/EP2017/076003
§ 371 (c)(1),
(2) Date: Apr. 10, 2019

(87) PCT Pub. No.: WO2018/069421
PCT Pub. Date: Apr. 19, 2018

(65) Prior Publication Data
US 2019/0297732 A1  Sep. 26, 2019

(30) Foreign Application Priority Data
Oct. 14, 2016  (EP) ..................... 16193971

(51) Int. Cl.
*H05K 1/11* (2006.01)
*H05K 3/38* (2006.01)
(Continued)

(52) U.S. Cl.
CPC .............. *H05K 3/385* (2013.01); *H05K 1/119* (2013.01); *H05K 3/282* (2013.01); *H05K 3/285* (2013.01);
(Continued)

(58) Field of Classification Search
CPC .................................................. H05K 1/119
(Continued)

(56) References Cited

U.S. PATENT DOCUMENTS

| 5,484,688 A | 1/1996 | Horn et al. |
| 2014/0261897 A1* | 9/2014 | Wei .................. H05K 3/385 148/276 |

(Continued)

FOREIGN PATENT DOCUMENTS

WO   2009125845   10/2009

OTHER PUBLICATIONS

Verbockhaven D et al; "OSP coatings: the nitrogen solution", Electronic Manufacturing Technology Symposium, 1995, Proceedings of 19 95 Japan International, 18th IEEE/CPMT International Omiya, Japan Dec. 4-6, 1995, New York, NY, USA, IEEE, US, Dec. 4, 1995, pp. 101-104.
(Continued)

*Primary Examiner* — Stanley Tso
(74) *Attorney, Agent, or Firm* — Renner, Otto, Boisselle & Sklar, LLP (57) ABSTRACT

A method for manufacturing a printed circuit board, comprising in order steps (i) providing a non-conductive substrate having on a surface copper circuitry with a copper surface, wherein said surface is chemically treated by (a) oxidation and subsequent reduction reaction and/or (b) organic compound attached to said surface, a permanent, non-conductive, not fully polymerized cover layer covering at least partially said surface, (ii) thermally treating the substrate with the cover layer at temperature from 140° C. to 250° C. in atmosphere containing molecular oxygen at 100000 ppm or less, based on the total volume of the atmosphere, wherein a substrate with a permanent, non-conductive cover layer is obtained, with the provisos that (ii) is after (i) but before any metal or metal alloy is deposited onto the cover layer, and that in (ii) the cover layer is fully polymerized in one thermal treating step, if the cover layer is a solder mask.

14 Claims, 2 Drawing Sheets

(51) Int. Cl.
*H05K 3/28* (2006.01)
*H05K 3/46* (2006.01)

(52) U.S. Cl.
CPC .............. *H05K 3/287* (2013.01); *H05K 3/465* (2013.01); *H05K 3/281* (2013.01)

(58) Field of Classification Search
USPC ........................................................ 174/246
See application file for complete search history.

(56) References Cited

U.S. PATENT DOCUMENTS

2014/0262897 A1    9/2014  Wei et al.
2015/0307999 A1*  10/2015  Lutzow ..................... C23F 1/18
                                                                     216/106

OTHER PUBLICATIONS

PCT/EP2017/076003; PCT International Search Report and Written Opinion of the International Searching Authority dated Jan. 25, 2018.

* cited by examiner

METHOD FOR MANUFACTURING A PRINTED CIRCUIT BOARD

The present application is a U.S. National Stage Application based on and claiming benefit and priority under 35 U.S.C. § 371 of International Application No. PCT/EP2017/076003, filed 12 Oct. 2017, which in turn claims benefit of and priority to European Application No. 16193971.5 filed 14 Oct. 2016, the entirety of both of which is hereby incorporated herein by reference.

FIELD OF THE INVENTION

The present invention relates to a method for manufacturing a printed circuit board (PCB) and a printed circuit board.

BACKGROUND OF THE INVENTION

A PCB is a thin board for mounting electrical parts on at least one of its surfaces, such as integrated circuits (ICs), resistors, switches, and the like, in order to obtain a printed circuit board assembly (PCBA). During the manufacturing process of a PCB typically a copper circuitry is formed on a non-conductive, insulating substrate/layer, which is typically made of an epoxy resin or a polyimide resin. The most common non-conductive substrate/layer is a glass-reinforced epoxy laminate, commercially known as FR-4.

In order to obtain a multi-layer PCB, typically a stack of non-conductive, insulating substrates/layers with its conductive copper circuitries is formed to obtain a one piece product.

Typically, during PCB manufacturing (in particular during manufacturing a multi-layer PCB) two particular types of non-conductive, insulating substrates/layers are utilized, which are permanent: (i) the aforementioned non-conductive, insulating substrates/layers also called build-up layers, pre-pregs, inner layers, insulating layers etc. forming within a multi-layer PCB the non-conductive, insulating substrates/layers between circuitries and (ii) solder masks (also often referred to as solder resists, outer layers etc.) covering and protecting the outer most circuitry in multi-layer and non-multi-layer PCBs.

A solder mask is, after its polymerization (also called curing or hardening), a fully polymerized, permanent layer of non-conductive material which covers the surface of the outer most non-conductive substrate/layer and most of its copper circuitry. A solder mask is patterned to fully cover the circuitry, except for those portions of the copper circuitry intended to be exposed for soldering. In such areas the solder mask typically exhibits openings, such as pad openings.

Usually, in a first step, a solder mask is formed from a photo imageable composition which is applied to the surface of the non-conductive substrate/layer to form a photo imageable cover layer. In a second step, after a brief pre-polymerization of the photo imageable cover layer at a temperature usually in the range from 70° C. to 80° C., the photo imageable cover layer is typically exposed to actinic radiation which is patterned by means of a template or artwork. Subsequent to exposure, the photo imageable cover layer is developed in a developer solution (an organic solvent, an aqueous, or semi-aqueous solution) which washes away unexposed portions of the cover layer. Afterwards, a photo imageable cover layer with openings remains, which is fully polymerized at a temperature typically in the range from 150° C. to 200° C., to form a non-conductive, fully polymerized, patterned, and permanent solder mask intended to protect the circuitry on the outer surface of the PCB for its entire life time.

Afterwards, the PCB is subjected to a soldering process and a metal or metal alloy is deposited into said openings. A typical procedure is a metal deposition out of a metal containing electrolyte by means of electroless metal deposition. A commonly deposited metal is tin. However, according to our own experiments such metal containing electrolytes often show a tendency to infiltrate the non-conductive, fully polymerized, patterned, and permanent solder mask especially at the edges of the openings. As a result, in the vicinity of the openings the metal is sometimes deposited underneath the solder mask, mainly between the solder mask and the surface of the copper circuitry. It is assumed that insufficient adhesion (and along with it a certain delamination) between the solder mask around an opening and the respective copper surface of the copper circuitry is the reason of this infiltration.

U.S. Pat. No. 5,484,688 A discloses in its abstract "a process for the patterned metallisation of structured printed circuit boards in which the fully structured printed circuit board is covered with a solder stop mask, with the solder contact locations being left open, the solder stop mask is heated under such conditions that complete hardening does not yet occur and the copper surface of the printed circuit board is practically not oxidized, metal is deposited out of an aqueous bath at the exposed solder contact locations and after the metal deposit operation the mask is heated sufficiently long to a sufficiently high temperature that the mask is completely hardened throughout. The incomplete pre-hardening step prevents the solution infiltrating under the mask in the metallisation operation and thereby loosening the adhesion thereof."

The process disclosed in U.S. Pat. No. 5,484,688 A is a two-step process, including a pre-polymerization step of the solder mask prior to soldering and a post-polymerization step after soldering in order to obtain a fully polymerized, patterned, and permanent solder mask. According to claims 7 and 8 in U.S. Pat. No. 5,484,688 A "the solder stop mask [ . . . ] [is] heated prior to the metal deposit operation with the exclusion of oxygen" and "under a protective gas atmosphere", respectively.

However, out of several practical reasons, a two-step thermal polymerization is very much undesired by PCB manufacturers. First, commercially available solder masks and solder mask materials are not characterized and specified for a two-step thermal polymerization. Since solder masks are typically fully polymerized in a single thermal treating step, no individual temperature range is defined for a respective pre- and post-polymerization step. Such additional specifications have to be carried out and determined each individually for each solder mask.

Second, a PCB with an only pre-polymerized solder mask, handled for example in an automated soldering process is vulnerable to scratches and scares caused by mechanically hard/solid components, such as a conveyor roller. The less polymerized (hardened) the solder mask is the higher is the risk of damaging the solder mask during the automated soldering process. This easily increases the number of defective goods. Furthermore, solder masks are becoming thinner and thinner (e.g. having a layer thickness of 20 μm or less) and, thus, are more susceptible to mechanical defects.

Third, a not fully polymerized solder mask tends to increase its volume due to the incorporation of water or other solvents. Such a so called post swelling is undesired (and usually takes place only if the solder mask is not fully polymerized), in particular for fine line circuitry, because of the dimensional changes and delocalizations of the openings in the solder mask.

Fourth, a two-step thermal polymerization usually requires a first heating unit for the pre-polymerization and an additional heating unit for the post-polymerization. However, such a heating unit arrangement is undesired because of additional costs and streamlining reasons.

WO 2009/125845 A1 discloses a method for manufacturing a flexible wiring board. In the method, heat treatment for reacting a polyimide compound constituting a polyimide layer, on which a predetermined pattern has been formed by exposure and alkali developing treatment, with a crosslinking agent is performed under an atmosphere having an oxygen concentration of not more than 1% by volume. The heat treatment in the very low oxygen content of not more than 1% by volume can prevent a change in color in not only an exposed surface of a conductor circuit but also an interface between a conductor and the polyimide layer and can prevent the occurrence of the lifting of the polyimide layer after plating.

In order to additionally increase adhesion between a solder mask and a surface of a copper circuitry various copper surface treatments (also sometimes called peel strength increasing surface treatments) are known.

In WO 2012/005722 A1, claim 1 a "method of treating a metal surface to promote adhesion between the metal surface and an organic material [is disclosed] characterized in that: a metal oxide layer is formed on the metal surface, and formation of the metal oxide layer is controlled by a self-limiting reaction between the metal oxide and a surface modifier compound". This reaction includes an oxidation and subsequent reduction reaction of the copper surface. According to examples 2 and 5 this reaction is applied to a build-up layer and a solder mask, respectively. However, polymerization of said build-up layer and solder mask is carried out in the presence of ambient air.

Similar to solder mask applications, delamination tendencies and adhesion problems occur and have been observed for build-up layer applications during multi-layer PCB manufacturing. Simply put, a multi-layer PCB is formed by alternately stacking build-up layers and copper circuitries. The build-up layers electrically insulate the copper circuitries from one another and furthermore provide stability. However, vias are formed at well defined positions, electrically connecting a circuitry of one layer with one or more than one circuitries of other layers. Such vias are formed for example by use of a laser, plasma, photo methods or conventional drilling.

Usually, a build-up layer is vacuum laminated onto a respective non-conductive substrate/layer and covers the copper circuitry of said substrate/layer. The build-up layer is subsequently pressed and subjected to a first thermal treating step to obtain a sufficiently pre-polymerized build-up layer. A temperature in the range from 170° C. to 200° C. is usually applied for approximately 30 minutes. It is common to apply this thermal treating in an oven with hot, clean air, i.e. in the presence of molecular oxygen.

Subsequent to that first thermal treating step, the pre-polymerized build-up layer is in a condition for patterning, in particular for via formation. Afterwards, the surface of the build-up layer and via surfaces are usually desmeared and basically in condition for forming the next copper circuitry in the multi-layer PCB.

The process of forming the next copper circuitry is carried out, for example, by means of (i) a subtractive process usually starting by laminating a copper foil, (ii) a semi-additive process (SAP) or advanced modified semi-additive process (AMSAP) typically starting with an electrolessly deposited copper layer, and (iii) a full-additive process (FAP) starting with forming a temporarily, structured photo resist layer for selectively depositing copper. Of these processes, the SAP is typically applied, in particular for manufacturing high density PCBs.

In the SAP, a copper layer is electrolessly deposited onto the build-up layer surface prior to a second thermal treating step usually carried out at a temperature in the range from 100° C. to 150° C. for at least 30 minutes (also often referred to as drying step). In this thermal treating step heat is applied to a pre-polymerized, copper plated build-up layer.

In a next step, a temporary, photo sensitive layer of non-conductive material (photo resist layer) is formed onto the layer of electrolessly deposited copper, subsequently patterned to form openings, and cured. Afterwards, additional copper is deposited into the openings.

In a last step, the temporary, photo sensitive layer and residual copper layer are removed. As a result, the copper circuitry of the next layer is formed.

It is essential that no delamination occurs during the life time of a multi-layer PCB. Therefore, it is desired that the adhesion between a copper circuitry and a build-up layer is as high as possible and remains during the life time of a PCB.

According to our own experiments, build-up layers sometimes suffer the disadvantage that insufficient adhesion results in delamination at the interface between copper surface and build-up layer, blisters are formed after stress testing, and wedge voids are formed in the proximity of blind micro vias (BMVs).

OBJECTIVE OF THE PRESENT INVENTION

It was therefore the objective of the present invention to overcome the aforementioned disadvantages, in particular to provide an improved method for manufacturing a PCB, which can equally applied to both types of permanent and non-conductive cover layers in a multi-layer PCB, namely solder masks and build-up layers, prevents metal infiltration between the permanent and non-conductive cover layer and the copper surface, and at the same time increases (improves) the adhesion between copper surface and cover layer, in particular if very thin cover layers are used, and generally is faster, less complex and more reliable (e.g. resulting in manufacturing less defective goods).

BRIEF DESCRIPTION OF DRAWINGS

FIG. 1B is a photomicrograph of tin soldered openings in which solder mask has not infiltrated.

DESCRIPTION OF THE INVENTION

The aforementioned objectives are solved by a method for manufacturing a printed circuit board, the method comprising in this order the steps:

(i) providing a non-conductive substrate having on at least one surface
a copper circuitry with a copper surface, wherein the copper surface is
chemically treated by (a) an oxidation and subsequent reduction reaction and/or (b) an organic compound attached to the copper surface,
a permanent, non-conductive, not fully polymerized cover layer covering at least partially said copper surface,
(ii) thermally treating the substrate with the permanent, non-conductive, not fully polymerized cover layer at a temperature in the range from 140° C. to 250° C. in an atmosphere, which contains molecular oxygen in an amount of 100000 ppm or less, based on the total volume of the atmosphere, such that a substrate with a permanent, non-conductive cover layer is obtained, the cover layer being more polymerized compared to step (i),
with the proviso:
that step (ii) is carried out after step (i) but before any metal or metal alloy is deposited onto the permanent, non-conductive, not fully polymerized cover layer, and
that in step (ii) the permanent, non-conductive, not fully polymerized cover layer is fully polymerized in solely one single thermal treating step, if the cover layer is a solder mask.

Our own experiments have shown that the method of the present invention (as defined throughout the text) impressively prevents infiltration (in particular tin infiltration) in solder mask applications and significantly results in good adhesion in build-up layer applications after subjecting to highly accelerated stress tests (HAST, 96 hours, 130° C., 85% rh). It is assumed that the method of the present invention to the greatest extent possible prevents oxidation of the copper surface of the copper circuitry during manufacturing the PCB.

According to step (i) of the method of the present invention a non-conductive substrate is provided. On at least one surface of the provided non-conductive substrate the substrate has
a copper circuitry with a copper surface, and
a permanent, non-conductive, not fully polymerized cover layer covering at least partially said copper surface.

Furthermore, said copper surface is a chemically treated copper surface. In other words, the provided non-conductive substrate with such a copper surface exhibits already this chemically treated copper surface which is at least partially covered with said cover layer.

Such a chemically treated copper surface is characterized by a surface modification of the copper surface, expressed in a fine and thin chemical treatment layer, which increases adhesion and peel strength, respectively, to the cover layer. If the chemical treatment includes an oxidation and subsequent reduction reaction (referred to as (a) in the method of the present invention) the very first layers of copper atoms in the copper surface are converted. Typically, the conversion is self-limiting. If the chemical treatment includes individually or additionally a chemical treatment of attaching organic compounds (referred to as (b) in the method of the present invention) a layer of organic compounds is attached either directly to the copper atoms of the copper surface or to the oxidized and subsequently reduced copper atoms/copper ions obtained after (a). The chemical treatment layer includes both converted copper atoms and the layer of organic compounds. Typically, the chemical treatment layer including converted copper atoms and/or said organic compounds can be investigated, analyzed and measured by Fourier Transform Infrared Spectroscopy (FT-IR), Focused Ion Beam high resolution Scanning Electron Microscopy (FIB high resolution SEM), X-Ray Photoelectron Spectroscopy (XPS) and Transmission Electron Microscopy (TEM). Preferably, the analysis is carried out in vertical cross sections of respective samples. More preferably, the chemical treatment layer thickness is determined by means of FIB high resolution SEM.

However, in some cases it is preferred that the respective substrate is manufactured, which means that the chemical treatment as defined for step (i) is carried out as part of the method of the present invention. In this case a method according to the present invention for manufacturing a printed circuit board is preferred, comprising in this order the steps:
(i) providing a non-conductive substrate having on at least one surface
a copper circuitry with a copper surface, including the sub-steps:
(i-a) chemically treating the copper surface by (a) an oxidation and subsequent reduction reaction and/or (b) an organic compound attaching said compound to the copper surface,
(i-b) covering at least partially the copper surface obtained after (i-a) with a permanent, non-conductive, not fully polymerized cover layer,
(ii) thermally treating the substrate with the permanent, non-conductive, not fully polymerized cover layer at a temperature in the range from 140° C. to 250° C. in an atmosphere, which contains molecular oxygen in an amount of 100000 ppm or less, based on the total volume of the atmosphere, such that a substrate with a permanent, non-conductive cover layer is obtained, the cover layer being more polymerized compared to step (i-b),
with the proviso:
that step (ii) is carried out after step (i-b) but before any metal or metal alloy is deposited onto the permanent, non-conductive, not fully polymerized cover layer, and
that in step (ii) the permanent, non-conductive, not fully polymerized cover layer is fully polymerized in solely one single thermal treating step, if the cover layer is a solder mask.

In other words, a method of the present invention is preferred, wherein step (i) is:
(i) providing a non-conductive substrate having on at least one surface
a copper circuitry with a copper surface,
(i-a) chemically treating the copper surface by (a) an oxidation and subsequent reduction reaction and/or (b) an organic compound attaching said compound to the copper surface,
(i-b) covering at least partially the copper surface obtained after (i-a) with a permanent, non-conductive, not fully polymerized cover layer.

Preferably, prior to step (i-a) the copper surface is cleaned in a cleaning step, more preferably cleaned in an etch-cleaning step. In such an etch-cleaning step a cleaning solution is preferably used, preferably containing one or more than one acid and/or one or more than one oxidizing agent. Preferably, a mixture of an inorganic acid and hydrogen peroxide is used. A preferred inorganic acid is sulfuric acid.

After step (i) (including the above mentioned sub-steps (i-a) and (i-b)), the copper circuitry exhibits a copper surface comprising the chemical treatment layer as a result of the treatment step.

The term "oxidation and subsequent reduction" in step (i) refers to a chemical conversion process and its conversion products based on the oxidation reaction and the subsequent reduction reaction. If both (a) and (b) is present/carried out in step (i) of the method of the present invention (a) is carried out first, i.e. prior to (b). Thus, if (a) and (b) are carried out the organic compound according to (b) is predominantly attached to copper, the copper being in a predominantly reduced state.

The oxidation reaction is preferably carried out by one or more than one oxidizing agent selected from the group consisting of chlorites including chlorous acid, hypochlorites including hypochloric acid, peroxides including hydrogen peroxide, permanganates, perchlorates including perchloric acid, persulphates including peroxomonosulfates, peroxydisulfates and its related acids, and ozone.

The reducing reaction is preferably carried out by one or more than one reducing agent selected from the group consisting of organic reducing agents and inorganic reducing agents, preferably selected from the group consisting of aldehydes including formaldehyde, borohydrides, borane, and substituted boranes.

After the oxidation reaction copper is predominantly present in the oxidation number +2; after the reduction reaction predominantly in the oxidation number 0 although a certain amount of copper in the oxidation number +1 is unavoidable due to immediate re-oxidation of Cu-(0). However, copper in the oxidation number 0 is preferred. Thus, a mixture containing copper in the oxidation numbers 0 and +1 is typically present after the reduction reaction in the chemical treatment layer. Therefore, a method of the present invention (as defined above, preferably as defined as being preferred) is preferred, wherein in step (i) (a) the copper surface is chemically treated by oxidizing Cu-(0) into Cu-(I) and Cu-(II) and subsequently reducing said Cu-(I) and Cu-(II) in the copper surface such that Cu-(0) results. As mentioned before, after the reduction reaction, predominantly Cu-(0) results. The mixture containing copper in the oxidation numbers ±0 and +1 either forms the chemical treatment layer or the chemical treatment layer at least contains said mixture. The terms "subsequent"/"subsequently" denote a basically immediate reduction reaction following the oxidation reaction. In some cases it is preferred that a rinsing or conditioning step is included prior to the reduction reaction.

After (a) a surface roughening without etching is obtained (also called non-etching surface roughening). Despite this roughening effect, the surface is relatively smooth compared to conventional etching methods, which usually result in a very pronounced surface roughening or even surface destruction; usually including altering the conductor topography. On the contrary, the copper surface modification defined in (a) typically does not exceed 200 nanometers in depth and is therefore referred to as nano-structuring or a nano-structured surface. Thus, a method of the present invention (as defined above, preferably as defined as being preferred) is preferred, wherein the copper surface in step (i) comprises a chemical treatment layer on the copper surface, wherein 90% or more of the treatment layer have a thickness of 500 nm or less, preferably 300 nm or less, more preferably 180 nm or less, even more preferably 150 nm or less, most preferably 90% or more of the treatment layer have a thickness in the range from 50 nm to 100 nm. Preferably, these parameters are determined in a vertical cross section of a treatment layer. In such a cross section the area of the treatment layer is preferably determined by integration, wherein 90% or more of the area correspond to a layer thickness not exceeding e.g. 500 nm, based on the total area of the treatment layer in the cross section.

A method of the present invention (as defined above, preferably as defined as being preferred) is even more preferred, wherein the copper surface in step (i) comprises a chemical treatment layer on the copper surface, the treatment layer having a maximum thickness of 500 nm or less, preferably 300 nm or less, more preferably 180 nm or less, even more preferably 150 nm or less, most preferably the treatment layer has a maximum thickness in the range from 20 nm to 100 nm.

If (a) is present/carried out, a method of the present invention (as defined above, preferably as defined as being preferred) is preferred, wherein the oxidized and subsequently reduced copper surface exhibits a layer of converted copper with a maximum layer thickness of 200 nm or less, preferably of 160 nm or less, more preferably with a maximum layer thickness of 120 nm or less, even more preferably with a maximum layer thickness of 100 nm or less, most preferably with a maximum layer thickness of 50 nm or less.

According to our own experiments such a nano-structured surface provides various advantages. PCB's used in high frequency applications benefit from such comparatively smooth surfaces due to the decreased signal loss. Furthermore, only a minor amount of metallic copper on the copper surface is involved in the conversion reaction, leading to a decreased loss of metallic copper in the circuitry compared to conventional, harsh etching methods. In addition, an excellent adhesion is obtained. Therefore, in the method of the present invention it is preferred that at least (a) is carried out, more preferably (a) and (b).

According to (b) an organic compound is attached to the copper surface. "Attached", respectively "attaching", means to form a complex, to adhere, to adsorb such that a physicochemical linkage of the organic compound with the copper surface is obtained. As a result, the attached organic compound cannot easily removed by rinsing or washing under common rinsing and washing conditions. A method of the present invention (as defined above, preferably as defined as being preferred) is preferred, wherein the organic compound attached to the copper surface is an adhesion promotor and/or a compound forming complexes with Cu-(I), preferably a silane-based adhesion promotor and/or a compound forming complexes with Cu-(I).

A method of the present invention (as defined above, preferably as defined as being preferred) is preferred, wherein the organic compound is one or more than one compound selected from the group consisting of azoles, silanes, azole-silane-hybrids, and combinations thereof. This includes mixtures of more than one azole, mixtures of more than one silane, mixtures containing one or more than one azole and one or more than one silane. An azole-silane-hybrid is for example an azole moiety covalently connected with a silane moiety (also called silanized azole).

Step (i) includes a copper surface that is at least partially covered by a permanent, non-conductive, not fully polymerized cover layer, which means that the copper surface is preferably laminated with said cover layer. A respective lamination process is typically carried out under vacuum and increased temperature, often significantly below 140° C. Preferred is a method of the present invention (as defined above, preferably as defined as being preferred), wherein the permanent, non-conductive, not fully polymerized cover layer in step (i) is selected from the group consisting of solder masks and build-up layers, preferably is a solder mask. Thus, in some cases a method of the present invention is preferred (as defined above, preferably defined as being preferred), wherein the permanent, non-conductive, not fully polymerized cover layer in step (i) is a solder mask, preferably a solder mask as described throughout the present text. However, in other cases a method of the present invention is preferred (as defined above, preferably defined as being preferred), wherein the permanent, non-conductive, not fully polymerized cover layer in step (i) is a build-up layer, preferably a build-up layer as described throughout the present text.

The term "covering at least partially" denotes that in some cases distinct areas of the copper surface are not covered in order to form openings, for example contact pads. This in particular applies if the cover layer is a solder mask. Thus, in some cases a method of the present invention (as described above, preferably as described as being preferred) is preferred, wherein the permanent, non-conductive, not fully polymerized cover layer in step (i) exhibits openings exposing areas of the copper surface. However, preferred is that the majority of the copper surface is covered by the cover layer, preferably at least 80% of the copper surface is covered by the cover layer.

The term "permanent" denotes that a removal of the entire cover layer is not intended during the method of the present invention or after it. The cover layer is not a temporary cover layer but it most preferably stays for the entire life time of the PCB. However, the term does not exclude different temporary conditions of the permanent cover layer.

In some cases it is preferred that a printed circuit board manufactured by the method of the present invention (method as described above, preferably as described as being preferred) is a multi-layer printed circuit board. In this case in a first cycle of the method of the present invention the permanent, non-conductive, not fully polymerized cover layer in step (i) is a build-up layer, which forms the basis for the non-conductive substrate of step (i) in a subsequent second cycle of the method of the present invention. Thus, a method of the present invention (as described above, preferably as described as being preferred) is preferred, wherein the permanent, non-conductive, not fully polymerized cover layer in step (i) is a build-up layer, preferably a copper layer free build-up layer, more preferably a metal layer free build-up layer. In order to form for step (i) in the subsequent second cycle the non-conductive substrate having on at least one surface a copper circuitry, the copper layer free build-up layer is subjected to a copper metallization process after step (ii) of the first cycle in order to form the respective copper circuitry with a copper surface. Such a sequence of steps is typical for semi-additive processes and our own experiments have shown that the method of the present invention is in particular beneficial in such a sequence of steps. A metal layer free build-up layer is usually more susceptible to oxygen permeation compared to a build-up layer containing a metal layer. In the latter case, the metal layer usually decreases oxygen permeation through the build-up layer and, thus, naturally decreases the risk of copper oxidation on the copper surface during a subsequent thermal treating step. As a result, the method of the present invention advantageously decreases the risk of copper oxidation on the copper surface in case of metal layer free build-up layers and significantly increases adhesion properties (for further details about copper oxidation see text below).

The non-conductive substrate as defined in step (i) of the method of the present invention is in some cases preferably a core-substrate, which typically is the basis and starting point for building up a multi-layer PCB. Typically, core-substrates comprise a glass-cloth reinforced fiber material and a copper layer on the outside. Preferably, such a core-substrate additionally comprises one or more than one group of filler particles selected from the group consisting of $SiO_2$, $Al_2O_3$, $TiO_2$, $ZrO_2$. Such a core-substrate is not a build-up layer.

Preferably, in the method of the present invention the cover layer in step (i) does not comprise filler fibers, preferably does not comprise glass fibers. Instead, a method of the present invention (as described above, preferably as described as being preferred) is preferred, wherein the cover layer according to step (i) comprises filler particles, preferably one or more than one group of filler particles selected from the group consisting of $SiO_2$, $Al_2O_3$, $TiO_2$, $ZrO_2$, most preferably $SiO_2$.

A method of the present invention (as described above, preferably as described as being preferred) is preferred, wherein the permanent, non-conductive, not fully polymerized cover layer in step (i) is independently a dry film or a liquid. The term "independently" denotes that for example if more than one cover layer is used during manufacturing a PCB build-up layers may be used as dry films but the solder mask might be provided as a liquid.

The skilled person knows that a liquid cover layer in this context is not fully fluid but exhibits a certain viscosity typical in this technical field. In the same manner the skilled person knows that a dry film is not completely dry but rather contains a certain amount of a typical solvent.

A method according to the present invention (as defined above, preferably defined as being preferred) is preferred, wherein the cover layer in step (i) is a dry film solder mask or a liquid solder mask. Typically, dry film solder masks as well as liquid solder masks are equally utilized in the art. If the cover layer in step (i) is a build-up layer, a method according to the present invention (as defined above, preferably defined as being preferred) is preferred, wherein the cover layer in step (i) is a dry film build-up layer. The latter includes e.g. photo imageable dielectrics (PID) as build-up layers, which are photo-structured. Nevertheless, also liquid build-up layers have been developed and can be applied in the method of the present invention.

Typically, a solder mask is transparent. This allows the skilled person to quickly and qualitatively determine an oxidation of the copper surface underneath the solder mask. In the absence of oxidation a typical metallic copper color is observed, wherein in the presence of oxidation a typical dark/dark-brown color is observed. Thus, a method according to the present invention (as defined above, preferably defined as being preferred) is preferred, wherein the permanent, non-conductive, not fully polymerized cover layer in step (i) is transparent. Usually, build-up layers are not transparent. However, aforementioned photo imageable dielectrics as build-up layers exhibit at least a certain degree of transparency, which can be utilized to determine an oxidation of the copper surface.

A method according to the present invention (as defined above, preferably defined as being preferred) is preferred, wherein the permanent, non-conductive, not fully polymerized cover layer in step (i) has a layer thickness of 50 µm or less, preferably 40 µm or less, more preferably 33 µm or less, even more preferably 28 µm or less, most preferably 22 µm or less.

If the cover layer is a build-up layer, a method according to the present invention is preferred, wherein the build-up layer in step (i) has a layer thickness of 50 µm or less, preferably 33 µm or less, more preferably 21 µm or less, even more preferably 15 µm or less, most preferably 10 µm or less.

If the cover layer is a solder mask, a method according to the present invention is preferred, wherein the solder mask in step (i) has a layer thickness of 50 µm or less, preferably 40 µm or less, more preferably 33 µm or less, even more preferably 28 µm or less, most preferably 22 µm or less.

Our own experiments have shown that solder masks as well as build-up layers exhibiting a layer thickness of 30 µm or less, in particular of 20 µm or less are highly susceptible towards oxygen permeation during a thermal treating step. Thus, the method of the present invention is in particular beneficial for very thin cover layers, in particular below 30 µm.

In many cases, solder masks as well as build-up layers contain epoxy compounds. Typically, these compounds undergo severe structural changes upon step (ii), leading to the more or even fully polymerized cover layer obtained after step (ii). Thus, a method according to the present invention (as defined above, preferably defined as being preferred) is preferred, wherein the permanent, non-conductive, not fully polymerized cover layer in step (i) comprises epoxy compounds.

However, in some cases a method of the present invention (as defined above, preferably defined as being preferred) is preferred, wherein the cover layer in step (i) is a build-up layer comprising at least one compound selected from the group of compounds consisting of epoxy compounds, polyimides, cyanate esters, bismaleimide-triazine compounds, polypropylene ethers, and polyolefins, preferably the cover layer in step (i) is a build-up layer comprising epoxy compounds.

Typically and common in the art, polymerization of solder masks and build-up layers is carried out under ambient air (i.e. ambient atmosphere with approximately 78 vol.-% nitrogen and approximately 21 vol.-% oxygen, which equals 210000 ppm oxygen, based on the total composition of ambient air). Oxygen is the prevalent oxidizing compound in ambient air, which causes undesired oxidation of copper during a thermal treating step. It is assumed that this undesired oxidation significantly decreases adhesion between a copper surface and a solder mask/build-up layer. Furthermore, oxidized copper fosters infiltration. Thus, in the method of the present invention the atmosphere used in step (ii) contains molecular oxygen in an amount of 100000 ppm (10 vol.-%) or less, based on the total volume of the atmosphere. This includes that no other undesired oxidizing compounds are present in undesired amounts. Said atmosphere in step (ii) is a low reactive and very much preferably an inert atmosphere. Thus, a method of the present invention (as defined above, preferably defined as being preferred) is preferred, wherein the amount of molecular oxygen in the atmosphere is 50000 ppm (5 vol.-%) or less, preferably 10000 ppm (1 vol.-%) or less, more preferably 1000 (0.1 vol.-%) ppm or less, even more preferably 100 ppm (0.01 vol.-%) or less, most preferably 10 ppm (0.001 vol.-%) or less, even most preferably 5 ppm (0.0005 vol.-%) or less.

Preferred is a method of the present invention (as defined above, preferably defined as being preferred), wherein the atmosphere in step (ii) is an inert gas, preferably an inert gas selected from the group consisting of nitrogen, carbon dioxide, noble inert gas, and mixtures thereof, more preferably an inert gas selected from the group consisting of nitrogen, carbon dioxide, helium, argon, and mixtures thereof, most preferably the inert gas is nitrogen.

More preferably, the atmosphere is gaseous nitrogen with a nitrogen content of more than 99.0 vol.-%, based on the total volume of the atmosphere, preferably with a nitrogen content of more than 99.5 vol.-%, more preferably with a nitrogen content of more than 99.8 vol.-%, even more preferably with a nitrogen content of more than 99.9 vol-%, most preferably with a nitrogen content of more than 99.99 vol. %.

In some cases a method according to the present invention (as defined above, preferably as defined as being preferred) is preferred, wherein the atmosphere according to step (ii) is alternatively a vacuum. In such a case ambient air is evacuated instead of being replaced by one or more than one inert gas. The total volume of the vacuum forms the atmosphere. However, applying one or more than one inert gas is preferred in the method of the present invention. Thus, in some cases it is preferred that no vacuum is applied in step (ii) of the method of the present invention.

Preferred is a method of the present invention (as defined above, preferably defined as being preferred), wherein the temperature in step (ii) is in the range from 142° C. to 220° C., preferably in the range from 145° C. to 210° C., more preferably in the range from 150° C. to 205° C. According to our own experiments, the above mentioned preferred temperatures provide an optimal polymerization for both cover layers, solder masks as well as build-up layers.

Preferably, the temperature and the atmosphere as described above are applied in a suitable oven or curing device. Typically, the oven and the curing device, respectively, determine the total volume of the atmosphere in step (ii) of the present invention.

If the cover layer is a solder mask, the solder mask is fully polymerized in step (ii) of the method of the present invention in one single step. This means that the heat-driven polymerization is not interrupted. In other words, the full polymerization is carried out in solely one single thermal treating step (a one-step polymerization). This furthermore means that a metallization with a solder metal or solder metal alloy is carried out after the solder mask is fully polymerized.

If the cover layer is a build-up layer a full polymerization of the build-up layer is usually desired in a subsequent (e.g. second) thermal treating step. However, the term "being more polymerized compared to step (i)" means that at least a significant polymerization increase is obtained, preferably at least to an extent that molecular oxygen permeation through the less polymerized build-up layer is drastically reduced and a subsequent metallization can be safely carried out.

A method of the present invention (as defined above, preferably defined as being preferred) is preferred, wherein step (ii) is carried out for at least 10 minutes, preferably for at least 20 minutes, more preferably for at least 30 minutes. A thermally treating of less than 10 minutes often results in a permanent, non-conductive cover layer, which is insufficiently polymerized compared to step (i). Such an insufficient polymerization often causes mechanical defects in the cover layer during subsequent manufacturing steps.

A method according to the present invention (as described above, preferably as described as being preferred) is preferred, wherein step (ii) is carried out up to 180 minutes, preferably up to 120 minutes, more preferably up to 90 minutes. A thermally treating exceeding 180 minutes is in most cases not necessary. After 180 minutes the polymerization is either sufficient for further manufacturing steps (for example for build-up layers) or the cover layer is fully polymerized and, thus, no further polymerization can be achieved (for example for solder masks).

In particular preferred is a method according to the present invention (as described above, preferably as described as being preferred), wherein step (ii) is carried out for 20 to 180 minutes, preferably for 20 to 150 minutes.

According to our experiments, the method of the present invention provides a significant increase in adhesion compared to a method carried out in the presence of ambient air but otherwise being identical to the method of the present invention. Adhesion is often quantified by peel strength tests. A preferred peel strength test is described in the example section in the text below. In such a test the strength is determined which is needed in order to separate the cover layer from the copper surface. Preferred is a method according to the present invention (as described above, preferably as described as being preferred), wherein the peel strength for separating the cover layer from the copper surface (preferably after HAST conditions as defined throughout the text) is increased by at least 10% compared to the peel strength for identically separating such a cover layer from a respective copper surface, the cover layer onto the respective copper surface being obtained from a method carried out in the presence of ambient air in step (ii) but otherwise being identical to the method of the present invention, preferably by at least 30%, more preferably by at least 50%, even more preferably by at least 70%, most preferably by at least 100%. For such a peel strength test the peel strength resulting from the interface between copper surface and cover layer is considered.

Preferred is a method of the present invention (as defined above, preferably defined as being preferred) additionally comprising after step (ii) the following step:
(iii) depositing one or more than one metal or metal alloy at least partly onto (A) the cover layer or (B) the copper surface not being covered by the cover layer.

If the cover layer in the method of the present invention is a solder mask the copper surface is not fully covered by the solder mask. Typically, the solder mask contains openings giving access to defined areas of the copper circuitry's copper surface. These openings are subsequently filled with a solder metal, most preferably tin, in order to create contact pads for electrically connecting the copper circuitry with electrical parts. A method of the present invention (as defined above, preferably defined as being preferred) is preferred, wherein the deposition of the one or more than one metal or metal alloy onto the copper surface not being covered by the cover layer is carried out after the solder mask is fully polymerized.

If the cover layer in the method of the present invention is a build-up layer, preferably a metal layer free build-up layer is utilized (see text above). In this case a metal seed layer, preferably a palladium seed layer, is deposited in step (iii) onto the thermally treated build-up layer obtained after step (ii). Thus, the deposition of the metal seed layer is performed after step (ii). Such a metal seed layer is preferably the starting point for an electroless deposition of copper. In a further sequence of steps a copper circuitry is formed on the build-up layer. As a result, a non-conductive substrate having on at least one surface a copper circuitry with a copper surface is obtained, which is ready for chemical treatment as defined in step (i) of the method of the present invention.

In some cases, a full or complete polymerization of the build-up layer is preferably carried out after the metal seed layer is deposited or the entire copper circuitry is formed. In this preferred case the full or complete polymerization of the build-up layer is either performed in an atmosphere, which contains an amount of molecular oxygen as defined in step (ii) of the method of the present invention or in an atmosphere containing ambient air. Such a full or complete polymerization of the build-up layer in the presence of ambient air is not necessarily detrimental. The high degree of polymerization already obtained by the method of the present invention significantly prevents the migration of molecular oxygen. Furthermore, said molecular oxygen migration is additionally significantly prevented due to the deposited metal layer onto the build-up layer.

Preferred is a method of the present invention (as defined above, preferably defined as being preferred), wherein the one or more than one metal independently is a metal selected from the group consisting of tin, nickel, gold, palladium, copper, and silver; respectively, the one or more than one metal alloy independently comprises a metal selected from the group consisting of tin, nickel, gold, palladium, copper, and silver.

If the cover layer in step (i) is a build-up layer the one or more than one metal independently is, respectively the one or more than one copper alloy independently comprises, a metal selected from the group consisting of palladium and copper.

If the cover layer in step (i) is a solder mask the one or more than one metal independently is, respectively the one or more than one copper alloy independently comprises, a metal selected from the group consisting of tin, nickel, gold, palladium, and silver, more preferably is selected from the group consisting of tin and nickel. The benefit of the method of the present invention is that no infiltration of the aforementioned metals was observed, in particular of tin. This is noteworthy because the deposition of tin as a soldering metal requires harsh conditions and easily results in infiltration.

The method of the present invention utilizes the excellent adhesion resulting from the combination of a chemically treated copper surface (i.e. a peel strength increasing surface treatment) and a subsequent thermal treating in an atmosphere, which contains molecular oxygen in an amount of 100000 ppm or less (preferably less, more preferably as defined above for the method of the present invention), based on the total volume of the atmosphere. Our experimental results show that this combination surprisingly results in a synergistic effect (see Example section). In particular for very thin cover layers the method of the present invention showed surprisingly good results.

Printed circuit boards are highly sophisticated electronic parts and need to fulfill high standards and demands. According to our experiments, printed circuit boards manufactured according to the method of the present invention (as defined above, preferably defined as being preferred) in particular show excellent results in the common HAST (96 hours, 130° C., 85% rh, see Example section).

The method of the present invention (as defined above, preferably defined as being preferred) is for manufacturing a printed circuit board. As mentioned in the text above, an excellent adhesion between cover layer and copper surface is obtained. Furthermore, no infiltration is observed for solder masks and build-up layers.

Thus, the present invention also refers to a printed circuit board comprising
a non-conductive substrate having on at least one surface
a copper circuitry with a copper surface, wherein the surface of the substrate and the copper surface is at least partly covered with a solder mask, the solder mask being transparent, and having a layer thickness of 20 μm or less, preferably of 15 μm or less, most preferably of 10 μm or less, wherein the copper surface underneath the solder mask is metallic copper-colored, and exhibits a layer of converted copper with a maximum layer thickness of 200 nm or less.

The aforementioned features regarding the method of the present invention apply likewise to the printed circuit board of the present invention (as defined above).

The term "metallic copper-colored" denotes the typical bright color of metallic copper but not the typical color of copper oxide, which is significantly dark brown. The skilled person is in the position to distinguish between metallic copper and copper oxide underneath the solder mask.

The invention is further explained by the following non-limiting examples.

EXAMPLES

A: Solder Mask Application:

Sample Preparation

Samples 1 to 6 (each comprising several identical specimens) were prepared as follows (see additionally Table 1 below for a summary):

Step (i):

Providing the Non-Conductive Substrate Having on at Least One Surface a Copper Circuitry with a Copper Surface:

Representing a non-conductive substrate having on at least one surface a copper circuitry with a copper surface, copper foils (150 mm×75 mm×35 μm) were used.

Cleaning of the Copper Surfaces:

In a first step, the copper surfaces of all copper foils were etch-cleaned by using a sulfuric acid/$H_2O_2$ solution containing 180 ml/L SoftClean UC168, 200 ml/L CupraEtch Starter, 75 ml/L Hydrox (all products of Atotech), and 545 ml/L DI water, to obtain etch-cleaned copper foils. The etch-cleaning removed heavy oxides and other compounds, such as anti-tarnishes and/or surfactants. After the etch-cleaning the etch-cleaned copper foils were rinsed with cold water for approximately two minutes. As a result etch-cleaned and rinsed copper foils were obtained. The copper surfaces of copper foils for sample 1 (comparative sample, not according to the present invention) were not further treated and subsequently subjected to laminating a solder mask (see text below).

In a second step, the copper surfaces of copper foils for samples 2 to 6 were further treated.

Sub-Step (i-a); Chemically Treating the Copper Surface:

(b) By an Organic Compound (Silanes):

Copper foils for samples 2 to 4 were immersed for 60 sec at 25° C. into a coating solution containing 1 weight-% of a silane and as solvents ethanol and DI water. The pH of the coating solution was 5 (adjusted with acetic acid). Three different coating solutions have been prepared, each containing a different silane:

for sample 2: 5-[[3-(trimethoxysilyl)propyl]thio]-1,3,4-thiadiazole-2(3H)-thione for sample 3: 5-[[3-(trimethoxysilyl)propyl]thio]-1,3,4-thiadiazol-2-amine for sample 4: 5-[[3-(trimethoxysilyl)propyl]thio]-4H-1,2,4-triazol-3-amine Afterwards the resulting copper foils were dried. As a result, silanized and dried copper foils for samples 2 to 4 were obtained. These copper foils were subsequently subjected to laminating a solder mask (see text below).

(a) By an Oxidation and Subsequent Reduction:

After etch-cleaning, copper surfaces of copper foils for samples 5 and 6 were chemically treated by an oxidation and subsequent reduction reaction. First, the copper foils for samples 5 and 6 were immersed for 30 sec at 50° C. into a conditioning solution containing 15.5 ml/L NovaBond IT Stabilizer (Atotech). The conditioner stabilizes a copper surface in terms of pH and electrochemical potential. As a result, conditioned copper foils for samples 5 and 6 were obtained.

Second, the conditioned copper foils were treated in an oxidizing solution comprising 100 ml/L NovaBond IT 102 (Atotech) and 15.5 ml/L NovaBond IT Stabilizer (Atotech). The treatment was carried out at 70° C. leading to a uniform and self-limiting conversion of Cu (0) into Cu (I/II) oxides, eventually forming a needle type layer of converted copper on the copper surface with a maximum layer thickness of less than 180 nm. After the oxidation reaction the oxidized copper foils were rinsed with cold water.

Third, the oxidized and rinsed copper foils were contacted with a reduction solution comprising 20 ml/L NovaBond IT Reducer (Atotech) and 5 ml/L NovaBond IT Stabilizer. The contacting was carried out at 35° C. for 5 minutes resulting in a reduction reaction. The reduction reaction converted Cu (I/II) species into Cu (0), thereby enhancing the stability of the copper surface towards chemicals (e.g. from the environment and/or subsequent metallization processes). After the reduction reaction the copper foils were rinsed with cold water for approximately two minutes. As a result, reduced and rinsed copper foils were obtained. Copper foils for sample 5 were subsequently subjected to laminating a solder mask (see text below).

After the reduction reaction, reduced and rinsed copper foils for sample 6 were subjected to a one minute immersion into a protector solution of 10 ml/L NovaBond IT Protector MK (Atotech) in DI water. Basically, the immersion into the protector solution is optional. If carried out it provides an attachment of an organic compound to the oxidized and subsequently reduced copper surface in order to avoid re-oxidation of reduced copper (corresponding to (b) in sub-step (i-a) as defined above). After the immersion, the copper foils for sample 6 were rinsed with cold water for approximately two minutes and subsequently dried. As a result, protected and rinsed copper foils for sample 6 were obtained. These copper foils were subsequently subjected to laminating a solder mask (see text below).

Sub-Step (i-b); Covering the Copper Surface with the Cover Layer:

In a first laminating step, a dry film type photo imageable solder mask (a permanent, non-conductive, not fully polymerized, acrylate and epoxy compounds containing cover layer) was vacuum laminated onto the copper surfaces of all six samples under yellow light in a clean room with a room temperature in the range from 20 to 25° C. and with a relative humidity of 50 to 60% by using a vacuum laminator (Dynachem VA 7124-HP6). Each solder mask has a layer thickness of 20 μm and is thus susceptible to molecular oxygen permeation.

The conditions for vacuum lamination were as follows:

first step: 100° C., vacuum: 30 sec. at 3 hPa, pressure: 30 sec at 0.5 MPa, second step: 80° C., pressure: 60 sec at 8 kgf/cm²

After lamination, laminated copper foils were obtained.

Prior to a thermal treating, the laminated copper foils were pre-polymerized photochemically by means of an UV bump with an applied total exposure energy of 1000 mJ/cm². In this step in particular the acrylate compounds are polymerized.

As a result, for each sample copper foils with a permanent, non-conductive, not fully polymerized solder mask were obtained.

TABLE 1 overview of sample design for solder mask applications

| sample | Etch-cleaning | Silane treatment* | Oxidation reaction | Reduction reaction | Protector treatment** | Solder mask |
|---|---|---|---|---|---|---|
| 1 | YES | NO | NO | NO | NO | YES |
| 2 | YES | YES | NO | NO | NO | YES |
| 3 | YES | YES | NO | NO | NO | YES |
| 4 | YES | YES | NO | NO | NO | YES |
| 5 | YES | NO | YES | YES | NO | YES |
| 6 | YES | NO | YES | YES | YES | YES |

*"Silane treatment" is chemically treating the copper surface by an organic compound (attaching the silanes to the etch cleaned copper surface)
**"Protector treatment" is chemically treating the copper surface by an organic compound (attaching the protector compounds to the oxidized and subsequently reduced copper atoms/copper ions)

Step (ii), Thermally Treating the Substrate:

In each sample at least one specimen was subjected to one of the following two thermal treatment steps:

Treatment for 60 min at 160° C. using a conventional hot air convection oven (Heraeus Oven UT 6200) (resulting in samples not according to the method of the present invention but instead resulting in comparative examples)

Samples subjected to such a thermal treatment are in the following additionally abbreviated as "+$O_2$" (e.g. Sample 1, +$O_2$), indicating that their thermal treatment took place in the presence of ambient air.

Treatment for 60 min at 160° C. in an oven (ATV PEP-603) exhibiting an atmosphere, which contains molecular oxygen in an amount of less than 5 ppm)

Samples subjected to this thermal treatment are in the following abbreviated as "−$O_2$" (e.g. Sample 1, −$O_2$), indicating that their thermal treatment took place in an inert atmosphere. "−$O_2$" samples can be either according to the invention or comparative examples, depending on whether the copper surface is chemically treated or not.

In each thermal treatment step the not fully polymerized solder mask was fully polymerized during said thermal treating and polymerized in solely one single thermal treating step, i.e. without interrupting the heat-driven polymerization (one-step polymerization). In this step in particular the epoxy compounds are polymerized.

Solder Mask Adhesion Evaluation Via Peel Strength Test:

For each sample (1 to 6) obtained after the thermal treating (including "+$O_2$" and "−$O_2$"), peel strength was determined:

(1) directly after the thermal treating as described above (also called initial peel strength),
(2) after 96 hours HAST (HAST conditions: 130° C., 85% rh, HAST chamber: EHS-221 M).

In order to determine the peel strength, several strip-type fragments have been prepared from each specimen by adhering the respective copper foils to a rigid board (identical size as the copper foils) in such a way that the rigid board faced the fully polymerized solder mask. As a result, copper foils with structurally enforced solder masks were obtained.

Afterwards, each enforced copper foil was sliced into said strip-type fragments (10×100 mm, Milling Cutter, Walter Lemmen CCD).

The strip-type fragments were subjected to a peel force measuring machine (Roell Zwick Z010) to individually evaluate the peel strength (angle: 90°, speed: 50 mm/min) which is needed to delaminate the copper foil from its respective structurally enforced solder mask. Typically, the higher the peel strength needed to avoid delamination the better is the adhesion.

The results of the peel strength tests are summarized in Table 2 below.

TABLE 2 peel strength in N/cm for solder mask applications

| | after thermal treating | | after HAST | |
|---|---|---|---|---|
| sample | +$O_2$ | −$O_2$ | +$O_2$ | −$O_2$ |
| 1 | 1.27 | 1.16 | 0.11 | 0.15 |
| 2 | 2.74 | 3.90 | 0.26 | 0.98 |
| 3 | 2.24 | 6.50 | 0.20 | 2.40 |
| 4 | 1.70 | 3.95 | 0.21 | 1.30 |
| 5 | 3.07 | 6.77 | 0.96 | 4.00 |
| 6 | 4.76 | 7.21 | 1.80 | 4.47 |

The entire sample 1 as well as all samples 2 to 6, +$O_2$ are comparative examples not being according to the present invention. All samples 2 to 6, −$O_2$ are in agreement with the method of the present invention.

Peel strength values for sample 1 are the lowest according to Table 2. Sample 1, −$O_2$ is based on the teaching disclosed in U.S. Pat. No. 5,484,688 A, wherein the solder mask was fully polymerized in a one-step polymerization. No peel strength increase was observed at all (see "after thermal treating") or at least no significant peel strength increase (see "after HAST") was obtained for sample 1 if an inert nitrogen atmosphere (−$O_2$) is used instead of ambient air (+$O_2$). Thus, merely polymerizing a solder mask on a copper surface (which is not treated by a peel strength increasing surface treatment) in an inert nitrogen atmosphere is insufficient to obtain a good adhesion.

Samples 2 to 6 experienced a peel strength increasing surface treatment (examples 5 and 6 were treated based on the teaching disclosed in WO 2012/005722 A1). According to Table 2, samples 1 to 6, +$O_2$ (after thermal treating) peel strength increased from 1.27 (sample 1, without peel strength increasing surface treatment) up to 4.76 (sample 6). Similar results were obtained after HAST; from 0.11 (sample 1) up to 1.80 (sample 6). This peel strength increase was obtained even in the presence of ambient air and derives from the surface treatment.

However, a surprising additional peel strength increase is achieved by combining (1.) a peel strength increasing surface treatment (preferably including an oxidation and subsequent reduction reaction) and (2.) a heat treatment in an inert atmosphere.

Table 2 shows that the combination of (1.) and (2.) exhibits a synergistic effect. The peel strength obtained after combining (1.) and (2.) exceeds the sum of peel strengths obtained for (1.) and (2.) individually. The results in Table 2 show that the inert nitrogen atmosphere synergistically increases the effect of the peel strength increasing surface treatment. Furthermore, a two-step process as disclosed in U.S. Pat. No. 5,484,688 A was avoided.

Solder Mask Adhesion Evaluation Via Infiltration Test (Tin Soldering):

Another six samples were prepared as outlined above under section A with the essential difference that Copper Clad Laminates (CCL) were used instead of copper foils.

Furthermore, after laminating the solder masks, a patterning of the solder masks was carried out in order to obtain openings in the solder mask having an opening diameter of approximately 200 μm.

For this purpose the CCLs laminated with solder masks were aligned onto a photomask and subsequently exposed to actinic radiation (using contact exposure unit EXM-1201-F02) with an exposure energy of 500 mJ/cm$^2$ at ambient temperature to obtain samples with selectively pre-polymerized solder masks. The solder masks were developed in an aqueous developer solution comprising approximately 1 weight-% of anhydrous sodium carbonate, rinsed with water, and subsequently subjected to a thermal treating as described above. As a result, samples with a permanent, patterned, non-conductive, fully polymerized solder mask where obtained.

The samples were at first cleaned at 50° C. for 5 minutes by using a sulfuric acid based cleaning solution (Proselect SF, Atotech) and subsequently rinsed with water.

Next, the copper surface exposed in the openings was micro-etched (etch depth approximately 1 μm) at 30° C. by means of a micro-etching solution of 100 g/L Copper Activator BC 65 (Atotech) and subsequently rinsed with water.

Afterwards, tin was deposited in a soldering process onto said exposed copper surfaces in a two-step procedure. First, immersion for 1 minute into a 22° C. deposition solution (Stannatech, Atotech) was carried out, followed by immersion for 15 minutes into an identical solution but exhibiting a temperature of 75° C. Afterwards, the respective samples were rinsed with water. Finally, tin soldered samples were obtained.

Infiltration quality was investigated by light microscopy (Olympus BX50).

Sample 1 showed severe delamination of the solder mask from the copper surface during the soldering process due to harsh tin soldering conditions for all specimens. No adequate tin deposition into the openings was possible; thus, no microscopic investigation was carried out.

Figure 1:
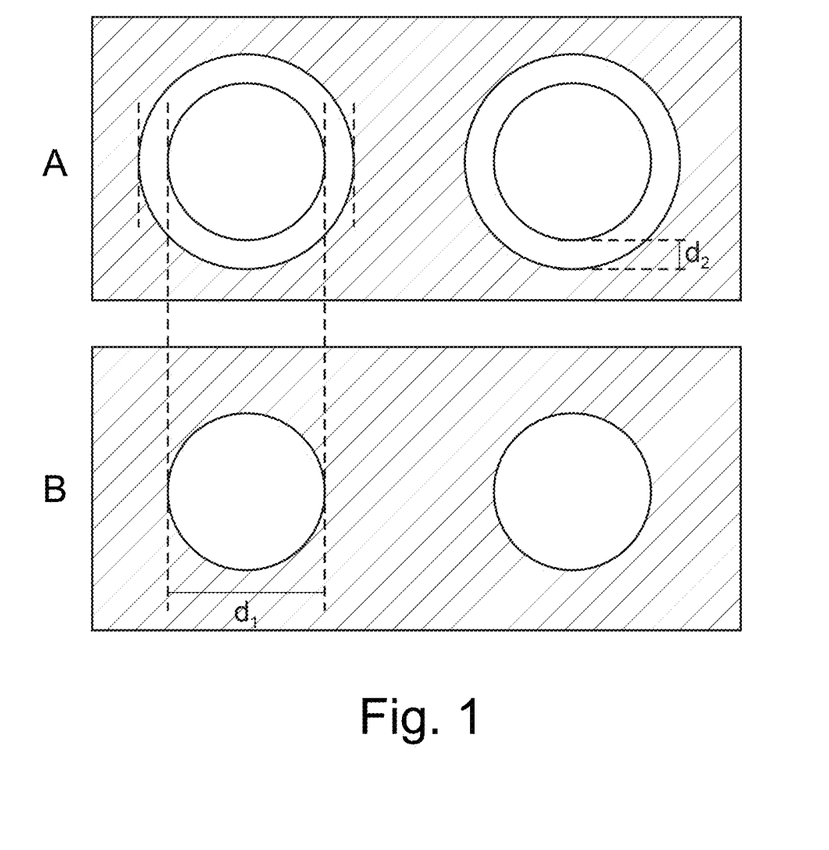
FIG. 1A is a schematic depiction of tin soldered openings in which solder mask has infiltrated.
FIG. 1B is a schematic depiction of tin soldered openings in which solder mask has not infiltrated.
Figure 2:
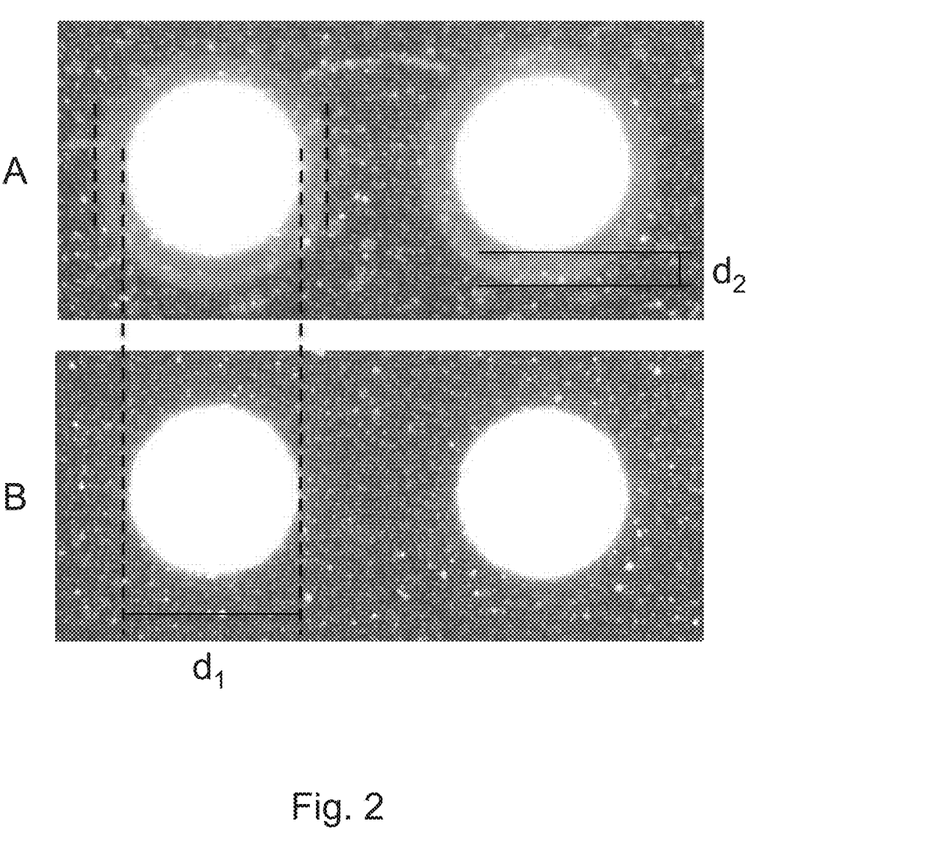
FIG. 2A is a photomicrograph of tin soldered openings in which solder mask has infiltrated.

Samples 2 to 6, $+O_2$ frequently showed undesired infiltration of tin between solder mask and copper surface, wherein for samples 2 to 6, $-O_2$ such infiltration was not observed. In FIG. 1, A and B tin soldered openings are schematically depicted as white circles with the diameter $d_1$ of approximately 200 μm. Non-infiltrated solder mask is depicted as hatched areas. Infiltrated tin underneath the solder mask is depicted as annulus with the width $d_2$ ($d_2$ is in the range from approximately 25 to 35 μm). The corresponding original figure is shown in FIG. 2. FIG. 1, A shows schematically tin infiltration as observed for sample 6, $+O_2$. In contrast, no tin infiltration was observed for sample 6, $-O_2$ as shown in FIG. 1, B. Similar results have been obtained for samples 2 to 5 (data not shown).

Printed circuit boards manufactured according to the method of the present invention allow tin soldering without infiltration of tin, in particular for solder masks having a thickness of 20 μm or less. Furthermore, preventing infiltration, in particular with tin, seems to be not alone a matter of adhesion. The results show that the aforementioned combination of (1.) a peel strength increasing surface treatment (preferably including an oxidation and subsequent reduction reaction) and (2.) a heat treatment in an inert nitrogen atmosphere (less than 5 ppm molecular oxygen) not only improves adhesion but additionally prevents infiltration (even for samples exhibiting comparatively low peel strength values; compare Table 1, samples 2 to 4 with samples 5 and 6). This is in particular true for very thin solder masks (in particular 20 μm or less), which tend to be permeable for molecular oxygen.

Samples 2 to 6, $-O_2$ also passed standard tape tests (results not shown)

B: Build-Up Layer Application:

For build-up layer applications two additional samples (samples 7 and 8) have been prepared. These samples were similarly prepared as outlined above under item A for solder mask applications, wherein build-up layers were used instead of solder masks and furthermore with the following differences:

in each lamination step the laminating parameters were as described above but with the essential difference that in the second step 100° C. was applied, the thermal treating was carried out as follows (for both: in the presence of ambient air and under inert gas (nitrogen), less than 5 ppm molecular oxygen): 60 min at a temperature in the range from 150° C. to 180° C., followed by 60 min at 200° C.

Primarily 20 μm typical epoxy-containing build-up layers were tested in a number of testing series. In addition, a number of results is obtained for identical epoxy-containing build-up layers but exhibiting a thickness of 40 μm.

TABLE 3 overview of sample design for build-up layer applications

| sample | Etch-cleaning | Silane treatment | Oxidation reaction | Reduction reaction | Protector treatment | Build-up layer |
|---|---|---|---|---|---|---|
| 7 | YES | NO | NO | NO | NO | YES |
| 8 | YES | NO | YES | YES | YES | YES |

Peel strength has been determined again after thermal treating and after HAST (HAST as defined above).

Peel strength results are summarized in Table 4.

TABLE 4 peel strength in N/cm for build-up layer applications

| | after thermal treating | | after HAST | |
|---|---|---|---|---|
| sample | $+O_2$ | $-O_2$ | $+O_2$ | $-O_2$ |
| 7 | 20 μm: 0.1-0.3 | 20 μm: 6-6.5 | 20 μm: 0.1-0.3 | 20 μm: 3.5-4.5 |
| 8 | 20 μm: 0.2-0.5 | 20 μm: 7.5-8 | 20 μm: 0.5-1 | 20 μm: 6.5-7 |
| | 40 μm: 5-6 | 40 μm: 11-12 | 40 μm: 4-5 | 40 μm: 8-9 |

Sample 7 is a comparative Example; no peel strength increasing surface treatment is present. In the presence of ambient air ($+O_2$), basically no adhesion is obtained (peel strength 0.1 to 0.3). All samples 8, $+O_2$ do not include a thermal treating in an atmosphere, which contains molecular oxygen in an amount of 100000 ppm or less (based on the total volume of the atmosphere), and, thus, are also not according to the present invention. On the contrary, all samples 8, $-O_2$ are according to the present invention.

As clearly shown in Table 4, peel strengths obtained for $-O_2$ is significantly increased compared to peel strengths obtained for $+O_2$ for both sample 7 as well as sample 8.

The peel strength increasing surface treatment carried out in Sample 8 increases the positive effect of the inert nitrogen atmosphere. Again, the combination of (1.) a peel strength increasing surface treatment (preferably including an oxidation and subsequent reduction reaction) and (2.) a heat treatment in an inert atmosphere surprisingly and synergistically increases peel strength unexpectedly.

Interestingly, sample 8, 40 µm shows relatively high peel strengths even in the presence of ambient air (+$O_2$). Although a significant peel strength increase is observed in each case in an inert nitrogen atmosphere (see samples 8, −$O_2$), this example shows that a 40 µm build-up layer is inherently less susceptible to molecular oxygen permeation compared to a 20 µm build-up layer.

Thus, the method of the present invention is in particular beneficial for build-up layers with a thickness of less than 40 µm.

The invention claimed is:

1. A method for manufacturing a printed circuit board, the method comprising in this order the steps:
   (i) providing a non-conductive substrate having on at least one surface
      a copper circuitry with a copper surface, wherein the copper surface is
         chemically treated by (a) an oxidation and subsequent reduction reaction and/or (b) an organic compound attached to the copper surface,
      a permanent, non-conductive, not fully polymerized cover layer covering at least partially said copper surface,
   (ii) thermally treating the substrate with the permanent, non-conductive, not fully polymerized cover layer at a temperature in the range from 140° C. to 250° C. in an atmosphere, which contains molecular oxygen in an amount of 100000 ppm or less, based on the total volume of the atmosphere, such that a substrate with a permanent, non-conductive cover layer is obtained, the cover layer being more polymerized compared to step (i),
   with the proviso:
      that step (ii) is carried out after step (i) but before any metal or metal alloy is deposited onto the permanent, non-conductive, not fully polymerized cover layer, and
      that in step (ii) the permanent, non-conductive, not fully polymerized cover layer is fully polymerized in solely one single thermal treating step, if the cover layer is a solder mask.

2. Method according to claim 1, wherein in step (i) (a) the copper surface is chemically treated by oxidizing Cu-(0) into Cu-(I) and Cu-(II) and subsequently reducing said Cu-(I) and Cu-(II) in the copper surface such that Cu-(0) results.

3. Method according to claim 1, wherein the copper surface in step (i) comprises a chemical treatment layer on the copper surface, the treatment layer having a maximum thickness of 500 nm or less.

4. Method according to claim 1, wherein the organic compound is one or more than one compound selected from the group consisting of azoles, silanes, azole-silane-hybrids, and combinations thereof.

5. Method according to claim 1, wherein the permanent, non-conductive, not fully polymerized cover layer in step (i) is selected from the group consisting of solder masks and build-up layers.

6. Method according to claim 1, wherein the permanent, non-conductive, not fully polymerized cover layer in step (i) is independently a dry film or a liquid.

7. Method according to claim 1, wherein the permanent, non-conductive, not fully polymerized cover layer in step (i) has a layer thickness of 50 µm or less.

8. Method according to claim 1, wherein the permanent, non-conductive, not fully polymerized cover layer in step (i) comprises epoxy compounds.

9. Method according to claim 1, wherein the amount of molecular oxygen in the atmosphere is 50000 ppm or less.

10. Method according to claim 1, wherein the atmosphere in step (ii) is an inert gas.

11. Method according to claim 1, wherein the temperature in step (ii) is in the range from 142° C. to 220° C.

12. Method according to claim 1, wherein step (ii) is carried out for at least 10 minutes.

13. Method according to claim 1 additionally comprising after step (ii) the following step:
   (iii) depositing one or more than one metal or metal alloy at least partly onto (A) the cover layer or (B) the copper surface not being covered by the cover layer.

14. Method according to claim 1, wherein step (i) is:
   (i) providing a non-conductive substrate having on at least one surface
      a copper circuitry with a copper surface,
   (i-a) chemically treating the copper surface by (a) an oxidation and subsequent reduction reaction and/or (b) an organic compound attaching said compound to the copper surface,
   (i-b) covering at least partially the copper surface obtained after (i-a) with a permanent, non-conductive, not fully polymerized cover layer.

* * * * *